US012626739B1

(12) United States Patent
Geist

(10) Patent No.: US 12,626,739 B1
(45) Date of Patent: May 12, 2026

(54) POINTER INFORMATION ENCODED IN WEIGHTED INCREMENT SIGNALS

(71) Applicant: Synopsys, Inc., Sunnyvale, CA (US)

(72) Inventor: Alan Stewart Geist, Gladstone, OR (US)

(73) Assignee: Synopsys, Inc., Sunnyvale, CA (US)

( * ) Notice: Subject to any disclaimer, the term of this patent is extended or adjusted under 35 U.S.C. 154(b) by 156 days.

(21) Appl. No.: 18/748,462

(22) Filed: Jun. 20, 2024

Related U.S. Application Data

(63) Continuation-in-part of application No. 18/510,037, filed on Nov. 15, 2023.

(51) Int. Cl.
　　*G11C 7/22* (2006.01)
　　*G11C 7/10* (2006.01)
(52) U.S. Cl.
　　CPC ............ *G11C 7/222* (2013.01); *G11C 7/1084* (2013.01); *G11C 7/1093* (2013.01)
(58) Field of Classification Search
　　CPC .................................. G11C 7/222; G11C 7/22

USPC ....................................................... 365/233.1
See application file for complete search history.

(56) References Cited

U.S. PATENT DOCUMENTS

| | | | | |
|---|---|---|---|---|
| 6,799,280 | B1 * | 9/2004 | Edenfield | H04L 7/0045 |
| | | | | 713/400 |
| 2013/0070880 | A1 * | 3/2013 | Tell | H04L 7/0012 |
| | | | | 375/354 |
| 2013/0254583 | A1 * | 9/2013 | Rifani | G06F 1/12 |
| | | | | 713/400 |
| 2020/0374161 | A1 * | 11/2020 | Durairaj | H03K 3/017 |

* cited by examiner

*Primary Examiner* — Muna A Techane

(57) ABSTRACT

An example non-transitory computer readable medium includes stored instructions which, when executed by a processor, cause the processor to convert an input clockwide pulse received from an upstream circuit running in a first clock domain into an output clockwide pulse that is synchronized to a second clock domain. The instructions further cause the processor to advance a count in response to the output clockwide pulse that is synchronized to the second clock domain.

20 Claims, 7 Drawing Sheets

*200*

400

| Receive An Electronic Signal Including A Single Clockwide Pulse In A First Clock Domain That Runs At A First Clock Frequency 402 |

| Generate A Plurality Of Clockwide Pulses In Proportion To A Ratio Of The First Clock Frequency Relative To A Second Clock Frequency 404 |

| Convert The Electronic Signal To A Single Clockwide Pulse In The Second Clock Domain That Runs At The Second Clock Frequency 406 |

| Advance A Count Of A Pointer Counter In Response To The Single Clockwide Pulse In The Second Clock Domain 408 |

| Output A Pointer Associated With The Electronic Signal Based On The Count 410 |

Receive An Electronic Signal Including A First Plurality Of Clockwide Pulses In A First Clock Domain That Runs At A First Clock Frequency 602

Convert A First Portion Of The Electronic Signal To A First Clockwide Pulse In A Second Clock Domain That Runs At A Second Clock Frequency, Using A First Pulse-To-Pulse Synchronzier Circuit Of A Bank Of Pulse-To-Pulse Synchronizer Circuits, Wherein The First Pulse-To-Pulse Synchronizer Circuit Weights The Second Clockwide Pulse By A First Weight Having A First Value, And Wherein The First Value Is Greater Than One 604

Convert A Second Portion Of The Electronic Signal To A Second Clockwide Pulse In The Second Clock Domain, Using A Second Pulse-To-Pulse Synchronzier Circuit Of The Bank Of Pulse-To-Pulse Synchronizer Circuits, Wherein The Second Pulse-To-Pulse Synchronizer Circuit Weights Clockwide Pulse By A Second Value 606

Advance A Count Of A Pointer Counter In Response To The First Clockwide Pulse (And The Second Clockwide Pulse, If Generated), Wherein The Count Is Advanced By A Number That Is At Least Equal To The First Value 608

Output A Pointer Associated With The Electronic Signal Based On The Count 610

FIG. 6

POINTER INFORMATION ENCODED IN WEIGHTED INCREMENT SIGNALS

RELATED APPLICATION

This application is a continuation-in-part of U.S. patent application Ser. No. 18/510,037, filed Nov. 15, 2023, which is herein incorporated by reference in its entirety.

TECHNICAL FIELD

The present disclosure generally relates to integrated circuits, and relates more particularly to communicating pointer information across clock domains by encoding the pointer information in weighted increment signals.

BACKGROUND

Synchronizing first-in-first-out circuits (also referred to as synchronizing FIFOs) are commonly used in digital logic designs that have multiple clock domains, particularly when those multiple clock domains are asynchronous (i.e., operating at different clock frequencies). For instance, a synchronizing FIFO can be used to synchronize data from a first clock domain into a different, second clock domain.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 4 illustrates an example method for conveying pointer information from a first clock domain to a different, second clock domain via an increment signal, according to the present disclosure;

FIG. 6 illustrates an example method for conveying pointer information from a first clock domain to a different, second clock domain via a weighted increment signal, according to the present disclosure.

DETAILED DESCRIPTION

Aspects of the present disclosure relate to communicating pointer information across clock domains by encoding the pointer information in increment or decrement signals. As discussed above, a synchronizing FIFO can be used to synchronize digital information from a first clock domain into a different, second clock domain. Internally, a synchronizing FIFO may use multi-bit gray-coded pointers, which can be passed from one clock domain to another through metastable filters even while changing. However, when gray-coded pointers are incremented, no more than a single bit can be changed with respect to the clock edge on read and write from the synchronizing FIFO. Thus, synchronizing FIFOs that utilize gray-coded pointers can support no more than a single read port and a single write port.

Instead of passing actual pointers such as gray-coded pointers from a first clock domain to a second clock domain, examples of the present disclosure may pass increment signals which, upon receipt in the second clock domain, can be used to instruct a pointer counter in the second clock domain to advance its count by an amount that is equal to the number of increment signals that are passed and asserted. Any number of increment signals may be passed. Examples of the present disclosure are particularly useful in synchronizing FIFOs. The use of increment signals rather than gray-coded pointers allows a synchronizing FIFO to support more than one data input (write) port and/or more than one data output (read) port (and, thus to accept more than one input data word and/or to provide more than one output data word).

Technical advantages of the present disclosure therefore include, but are not limited to, the ability to support more than one data input (write) port and/or more than one data output (read) port in a synchronizing FIFO that passes data from a first clock domain to a different, second clock domain. This allows the synchronizing FIFO to write more than one data word input and/or read more than one data word output simultaneously (e.g., in a single clock period). Further examples of the present disclosure could be extended to add flexibility to other applications that involve the synchronization of monotonically incrementing or decrementing pointers (or other values) across multiple clock domains.

Figure 1:
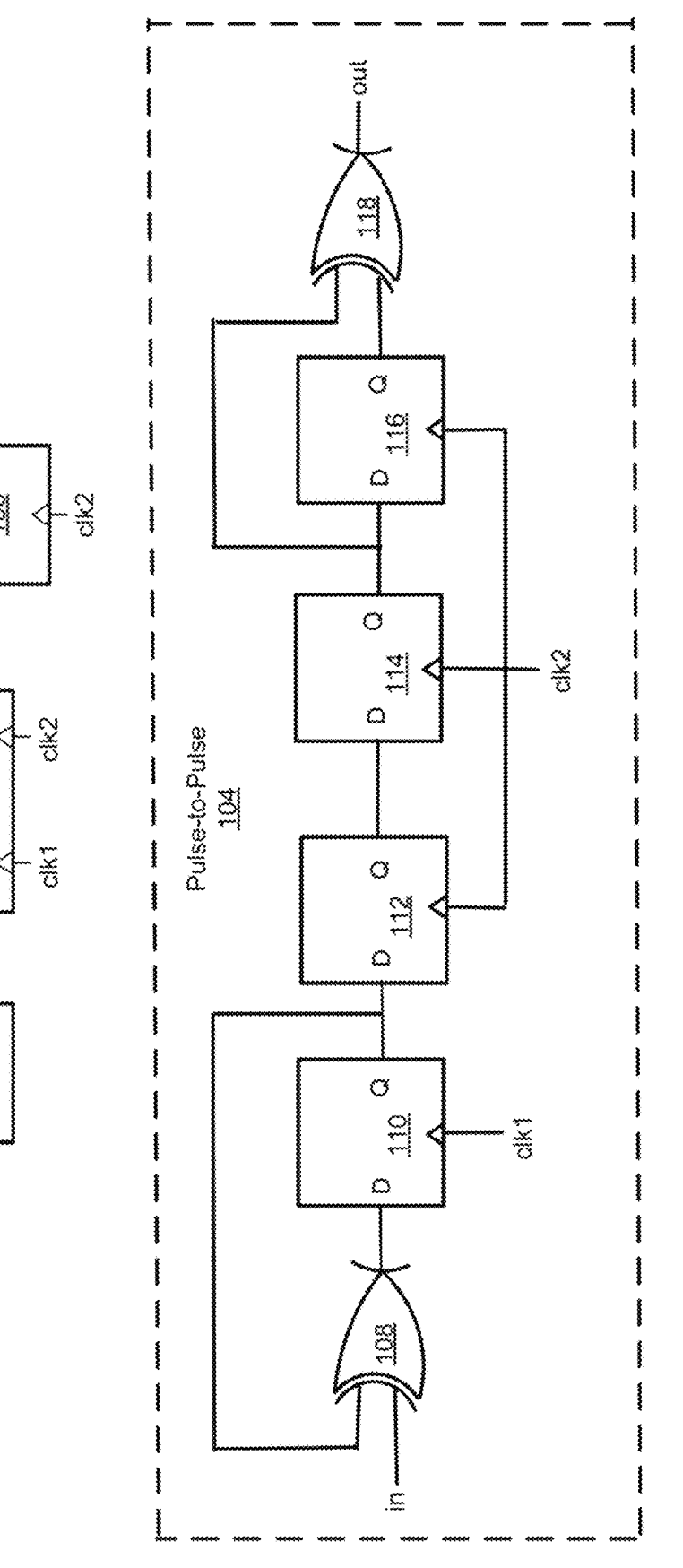
FIG. 1 illustrates an example circuit for synchronizing pointer increment signals of the present disclosure.

FIG. 1 illustrates an example circuit 100 for synchronizing pointer increment signals (also referred to herein as a synchronizing circuit) of the present disclosure. The circuit 100 illustrated in FIG. 1 is configured as a write-side synchronizing circuit. That is, the circuit 100 is configured to synchronize a pointer increment signal from a write clock domain into a read clock domain. However, it will be appreciated and shown in subsequent figures that the circuit 100 of the present disclosure may also be configured as a read-side circuit (i.e., such that the circuit 100 is configured to synchronize a pointer increment signal from a read clock domain into a write clock domain). As illustrated, the circuit 100 generally includes a pulse-to-pulse synchronizing circuit 104 and a write pointer counter 106. In one embodiment, the circuit 100 may also include a pulse cycler 102.

When a write signal is asserted, the pulse-to-pulse synchronizer circuit 104 will receive as an input a single clockwide pulse (i.e., a pulse the width of a single clock period, also referred to as a strobe) in a first clock domain (i.e., clk1 in FIG. 1). In one example, the pulse-to-pulse synchronizer circuit 104 includes a circuit that converts the single clockwide pulse from the first clock domain to a single clockwide pulse in a different, second clock domain (e.g., clk2 in FIG. 1). The first clock domain may be faster (i.e., operating at a higher frequency) than or slower (i.e., operating at a lower frequency) than the second clock domain; the pulse-to-pulse synchronizer circuit 104 conveys the clockwide pulse from the first clock domain to the second clock domain regardless of which clock domain operates at the higher frequency. In another example, the first clock domain and the second clock domain may operate at equal clock frequencies, but the phase relationship between the first clock domain and the second clock domain may be different (e.g., unknown, insufficiently constrained, and varying). Thus, the pulse-to-pulse synchronizer circuit 104 will receive the clockwide pulse in the first clock domain as an input and will produce as an output to the write pointer counter 106 the clockwide pulse in the second clock domain.

The inset in FIG. 1 illustrates an example configuration of the pulse-to-pulse synchronizer circuit 104 in greater detail. As illustrated, the pulse-to-pulse synchronizer circuit 104 receives a clock pulse in the first clock domain on its input port (in). Receipt of the clock pulse in the first clock domain may cause the output of a toggle circuit (having a first XOR gate 108 and a first flip flop 110 running in the first clock domain whose input is coupled to the output of the first XOR gate 108) to toggle from high to low or from low to high (depending on the state of the output prior to receipt of the clock pulse in the first clock domain). The output of the toggle circuit (e.g., a single clockwide pulse output by the first flip flop 110) is returned to one input of the XOR gate 108, while the other input of the XOR gate 108 receives a version of the toggle circuit output that is delayed by one clock cycle.

The single clockwide pulse output by the toggle circuit is also coupled, via the output of the first flip flop 110 to a synchronizer including a plurality of cascaded flip flops running in the second clock domain, which in one example includes at least a second flip flop 112 and a third flip flop 114. The input of the second flip flop 112 is coupled to the output of the first flip flop 110. When the single clockwide pulse is received by the synchronizer, the second flip flop 112 and the third flip flop 114 collectively enforce a delay on the single clockwide pulse that is, in one example, a minimum of two clock periods in the second clock domain.

The output of the third flip flop 114 (e.g., the delayed clockwide pulse) is coupled to both the input of a fourth flip flop 116 and one input of a second XOR gate 118. The second XOR gate 118 generates a clockwide active-high clock pulse in response to detecting the rising edge or falling edge of the output of the third flip flop 114. The fourth flip flop 116 provides a delay to aid the second XOR gate 118 in detecting an edge at the output of the third flip flop 114. The output of the second XOR gate 118 is the single clockwide pulse in the second clock domain which is delivered to the input of the write pointer counter 106.

In one example, the write pointer counter 106 includes a binary counter. For each clockwide pulse in the second clock domain that the write pointer counter 106 receives as an input from the pulse-to-pulse synchronizer circuit 104, the write pointer counter 106 will advance its count by one. The write pointer counter 106 will produce as an output a write pointer based on its count.

The pulse cycler 102 may be utilized when the first clock domain is faster than the second clock domain, in order to prevent the inherent maximum bandwidth limit of the slower second clock domain from being violated. For instance, if the write signal includes a single bit, and the first clock domain is running at a clock frequency that is 1.5 times faster than the clock frequency of the second clock domain, and there are two contiguous writes, then two clockwide pulses in the second clock domain would be needed in the pulse-to-pulse synchronizer circuit 104 to convey a double clockwide pulse from the first clock domain to the second clock domain. In this case, the pulse cycler 102 would drive the pulse-to-pulse synchronizer circuit 104 by alternating or cycling between two separately asserted clockwide pulses on its output, and the pulse-to-pulse synchronizer circuit 104 would include two circuits configured as illustrated in the inset.

Figure 2:
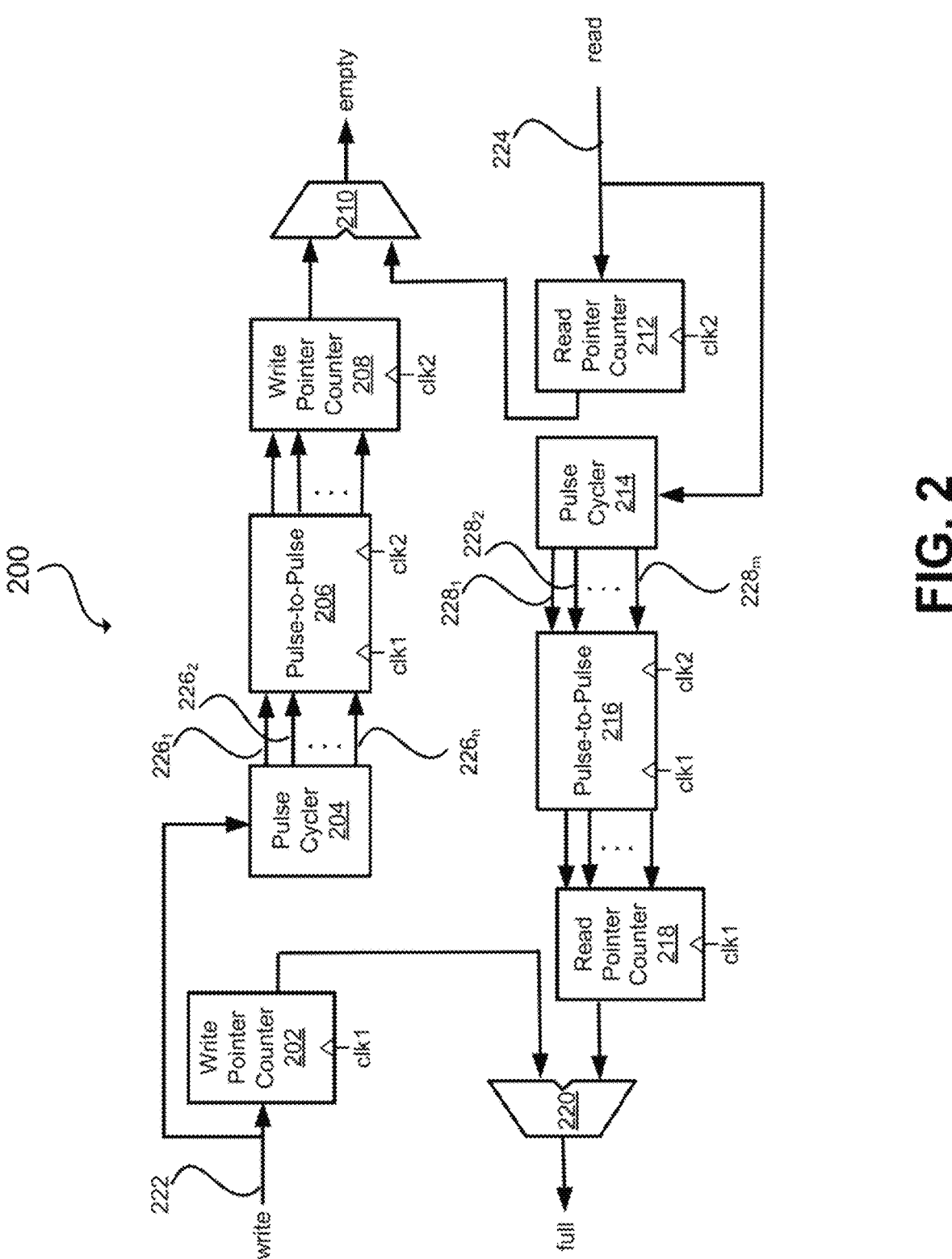
FIG. 2 illustrates an example pointer generation and synchronization circuit employing the circuit of FIG. 1.

FIG. 2 illustrates an example pointer generation and synchronization circuit 200 employing the circuit 100 of FIG. 1. In one example, the circuit 200 includes at least two different clock domains, namely, a write clock domain and a read clock domain that run at different clock frequencies.

In one example, the circuit 200 generally includes a first write pointer counter 202, a first pulse-to-pulse synchronizer circuit 206, a second write pointer counter 208, a first comparator 210, a first read pointer counter 212, a second pulse-to-pulse synchronizer circuit 216, a second read pointer counter 218 and a second comparator 220. If the circuit 200 includes more than one input (write) port and/or more than one output (read) port, the circuit 200 may further include a first pulse cycler 204 and/or a second pulse cycler 214. Collectively, the first pulse cycler 204, the first pulse-to-pulse synchronizer circuit 206, and the second write pointer counter 208 form a first synchronizing circuit that synchronizes a pointer increment signal from the write clock domain into the read clock domain of the circuit 200, while the second pulse cycler 214, second pulse-to-pulse synchronizer circuit 216, and second read pointer counter 218 form a second synchronizing circuit that synchronizes a pointer increment signal from the read clock domain into the write clock domain of the circuit 200.

In one example, the first write pointer counter 202 is a binary counter. The first writer pointer counter 202 runs in a first clock domain (clk1). In one example, each time a new write signal is asserted on the write line 222 of the circuit 200 as a clock pulse in the first clock domain, the new write signal is provided to an input of the first writer pointer counter 202. In response to receiving the new write signal, the first write pointer counter 202 will advance its count by a number that is equal to the number of write signals asserted on the write line 222.

An output of the first write pointer counter 202 is coupled to an input of the second comparator 220. Another input of the second comparator 220 is coupled to an output of the second read pointer counter 218. The first write pointer counter 202 and the second read pointer counter 218 may provide their counts, via their respective outputs, to the second comparator 220. As discussed in further detail below, the second comparator 220 may compare the counts of the first write pointer counter 202 and the second read pointer counter 218 in order to generate a "full" flag when the circuit 200 is incapable of accepting further writes.

Additionally, the new write signal that is asserted on the write line 222 of the circuit 200 will also be provided (as a clock pulse in the first clock domain) to an input of the first pulse cycler 204. In one example, the first pulse cycler 204 drives the first pulse-to-pulse synchronizer circuit 206 by cycling through a first set of increment signals $226_1$-$226_n$ (hereinafter individually referred to as an increment signal 226 or collectively referred to as increment signals 226). For instance, when the first pulse cycler 204 receives a first write signal, the first pulse cycler 204 will assert a first increment signal $226_1$ of the first set of increment signals 226 on an output of the first pulse cycler 204. When the first pulse cycler 204 receives a second write signal, the first pulse cycler 204 will assert a second increment signal $226_2$ of the first set of increment signals 226 on an output of the first pulse cycler 204. This continues until the first pulse cycler 204 asserts its $n^{th}$ increment signal $226_n$ in response to receiving an $n^{th}$ write signal. Upon receiving an $n^{+1th}$ write signal, the first pulse cycler 204 will cycle back to the beginning and assert the first increment signal $226_1$, again working its way through the first set of increment signals 226 in order. If there is no more than one write line 222, then the first set of increment signals 226 output by the first pulse cycler 204 will be zero or one-hot.

Any increment signals 226 asserted by the first pulse cycler 204 are output on an output of the first pulse cycler 204 and provided to an input of the first pulse-to-pulse synchronizer circuit 206. The first pulse-to-pulse synchronizer circuit 206 thus receives each increment signal 226 from the first pulse cycler 204 as a clock pulse in the first clock domain and outputs each increment signal 226 as a clock pulse in a different, second clock domain (clk2). The second clock domain may be slower than the first clock domain or faster than the first clock domain. In another example, the first clock domain and the second clock domain may operate at equal clock frequencies, but the phase relationship between the first clock domain and the second clock domain may be unknown, insufficiently constrained, or varying.

In one example, the first pulse-to-pulse synchronizer circuit 206 includes a bank of individual pulse-to-pulse synchronizer circuits (similar to the pulse-to-pulse synchronizer circuit 104 shown in the inset of FIG. 1), where a number of the pulse-to-pulse synchronizer circuits in the bank of pulse-to-pulse synchronizer circuits is equal to a number of increment signals 226 in the first set of increment signals (i.e., if the first set of increment signals contains n different increment signals 226, then the first pulse-to-pulse synchronizer circuit 206 will include a bank of n individual pulse-to-pulse synchronizer circuits). In one example where the first clock domain is faster than the second clock domain, the number n of increment signals in the first set of increment signals is equal to the maximum number of clock rising edges $R_{clk1}$ that can occur in the first clock domain between each adjacent pair of clock rising edges in the second clock domain. In a further example where the circuit 200 includes more than one input port (such that multiple writes can happen during a single clock pulse) and the first clock domain is faster than the second clock domain, the number n of increment signals in the first set of increment signals is equal to $R_{clk1}$ multiplied by the number of input ports.

Each individual pulse-to-pulse synchronizer circuit in the bank of pulse-to-pulse synchronizer circuits will generate a separate output. Any increment signals output by the first pulse-to-pulse synchronizer circuit 206 may be multiple-hot, especially if the first clock domain is faster than the second clock domain.

The output of the first pulse-to-pulse synchronizer circuit 206 is coupled to an input of the second write pointer counter 208. Thus, any clock pulses in the second clock domain (i.e., increment signals) that are output by the first pulse-to-pulse synchronizer circuit 206 will be input to the second write pointer counter 208.

In one example, the second write pointer counter 208 is a binary counter. Thus, the second write pointer counter 208 may be identical to the first write pointer counter 202, except for the fact that the first write pointer counter 202 runs in the first clock domain while the second write pointer counter 208 runs in the second clock domain. Due to latency in the first pulse-to-pulse synchronizer circuit 206, the second write pointer counter 208 may run behind the first write pointer counter 202. Receipt of a clock pulse in the second clock domain will cause the second write pointer counter 208 to advance its count by one. The second write pointer counter 208 will advance its count by an amount that is equal to a number of asserted outputs of the first pulse-to-pulse synchronizer circuit that the second write pointer counter 208 receives.

The output of the second write pointer counter 208 may be coupled to an input of the first comparator 210. Another input of the first comparator 210 may be coupled to an output of the first read pointer counter 212. The first read pointer counter 212 and the second write pointer counter 208 may provide their counts, via their respective outputs, to the first comparator 210. Thus, the first comparator 210 may compare the outputs of the second write pointer counter 208 and the first read pointer counter 212 (both of which run in the second clock domain) to generate an "empty" flag when the circuit 200 contains no data to read and indicates that the circuit 200 is able to accept a further write operation.

In one example, the first read pointer counter 212 is a binary counter. The first read pointer counter 212, as discussed above, runs in the second clock domain. In one example, each time a new read signal is asserted on the read line 224 of the circuit 200 as a clock pulse in the second clock domain, the new read signal is provided to an input of the first read pointer counter 212. In response to receiving the new read signal, the first read pointer counter 212 will advance its count by a number that is equal to the number of read signals asserted on the read line 224.

Additionally, the new read signal that is asserted on the read line 224 of the circuit 200 will also be provided (as a clock pulse in the second clock domain) to an input of the second pulse cycler 214. In one example, the second pulse cycler 214 drives the second pulse-to-pulse synchronizer circuit 216 by cycling through a second set of increment signals $228_1$-$228_m$ (hereinafter individually referred to as an increment signal 228 or collectively referred to as increment signals 228). For instance, when the second pulse cycler 214 receives a first read signal, the second pulse cycler 214 will assert a first increment signal $228_1$ of the first set of increment signals 228 on an output of the second pulse cycler 214. When the second pulse cycler 214 receives a second read signal, the second pulse cycler 214 will assert a second increment signal $228_2$ of the second set of increment signals 228 on an output of the second pulse cycler 214. This continues until the second pulse cycler 214 asserts its $m^{th}$ increment signal $226_m$ in response to receiving an $m^{th}$ read signal. Upon receiving an $m^{+1th}$ read signal, the second pulse cycler 214 cycles back to the beginning and assert the first increment signal $228_1$, again working its way through the first set of increment signals 228 in order. In one example, the number m of increment signals 228 in the second set of increment signals may be different than the number n of increment signals 226 in the first set of increment signals (i.e., n may or may not be equal to m).

Any increment signals 228 asserted by the second pulse cycler 214 are output on an output of the second pulse cycler 214 and provided to an input of the second pulse-to-pulse synchronizer circuit 216. The second pulse-to-pulse synchronizer circuit 216 thus receives each increment signal 228 from the second pulse cycler 214 as a clock pulse in the second clock domain and outputs each increment signal 228 as a clock pulse in the first clock domain.

In one example, the second pulse-to-pulse synchronizer circuit 216 includes a bank of individual pulse-to-pulse synchronizer circuits (similar to the pulse-to-pulse synchronizer circuit 104 illustrated in the inset in FIG. 1), where a number of the pulse-to-pulse synchronizer circuits in the bank of pulse-to-pulse synchronizer circuits is equal to a number of increment signals 228 in the second set of increment signals (i.e., if the second set of increment signals contains m different increment signals, then the second pulse-to-pulse synchronizer circuit 216 will have a bank of m individual pulse-to-pulse synchronizer circuits). In one example where the second clock domain is faster than the first clock domain, the number m of increment signals in the second set of increment signals is equal to the maximum number of clock rising edges $R_{clk2}$ that can occur in the second clock domain between each adjacent pair of clock rising edges in the first clock domain. In a further example where the circuit 200 includes more than one output port (such that multiple reads can happen during a single clock pulse) and the second clock domain is faster than the first clock domain, the number m of increment signals in the second set of increment signals is equal to $R_{clk2}$ multiplied by the number of output ports.

Each individual pulse-to-pulse synchronizer circuit in the bank of pulse-to-pulse synchronizer circuits will generate a separate output. Any increment signals output by the second pulse-to-pulse synchronizer circuit 216 may be multiple-hot, especially if the second clock domain is faster than the first clock domain.

The output of the second pulse-to-pulse synchronizer circuit 216 is coupled to an input of the second read pointer counter 218. Thus, any clock pulses in the first clock domain (i.e., increment signals) that are output by the second pulse-to-pulse synchronizer circuit 216 will be input to the second read pointer counter 218.

In one example, the second read pointer counter 218 is a binary counter. Thus, the second read pointer counter 218 may be identical to the first read pointer counter 212, except for the fact that the first read pointer counter 212 runs in the second clock domain while the second read pointer counter 218 runs in the first clock domain. Due to latency in the second pulse-to-pulse synchronizer circuit 216, the second read pointer counter 218 may run behind the first read pointer counter 212. Receipt of the clock pulse in the first clock domain will cause the second read pointer counter 218 to advance its count by one. The second read pointer counter 218 will advance its count by an amount that is equal to a number of asserted outputs from the second pulse-to-pulse synchronizer circuit 216 that the second read pointer counter 218 receives.

The output of the second read pointer counter 218 may be coupled to an input of the second comparator 220. As discussed above, another input of the second comparator 220 may be coupled to an output of the first write pointer counter 202. Thus, the second comparator 220 may compare the outputs of the second read pointer counter 218 and the first write pointer counter 202 (both of which run in the first clock domain) to generate a "full" flag when the circuit 200 is incapable of accepting further writes as discussed above.

In some examples, the first pulse cycler 204 or the second pulse cycler 214 may be omitted from the circuit 200. For instance, if the circuit 200 includes no more than one write port and no more than one read port, then a pulse cycler will not be needed on the side where the data is being passed from a slower clock domain to a faster clock domain. As an example, if the first clock domain (clk1) in FIG. 2 is slower than the second clock domain (clk2), then the first pulse cycler 204 may be omitted, and a single write signal that is asserted on the write line 222 passes directly to the first pulse-to-pulse synchronization circuit 206. However, the second pulse cycler 214 may still be used to pass data from the second clock domain to the first clock domain, since multiple read signals could be received in the second clock domain between each pair of clock signals in the first clock domain (which could exceed the inherent bandwidth of the second pulse-to-pulse synchronizer circuit 216 and ultimately result in the loss of some read signals). Thus, the first pulse cycler 204 and/or the second pulse cycler 214 may be omitted from the circuit 200 in certain embodiments.

Figure 3:
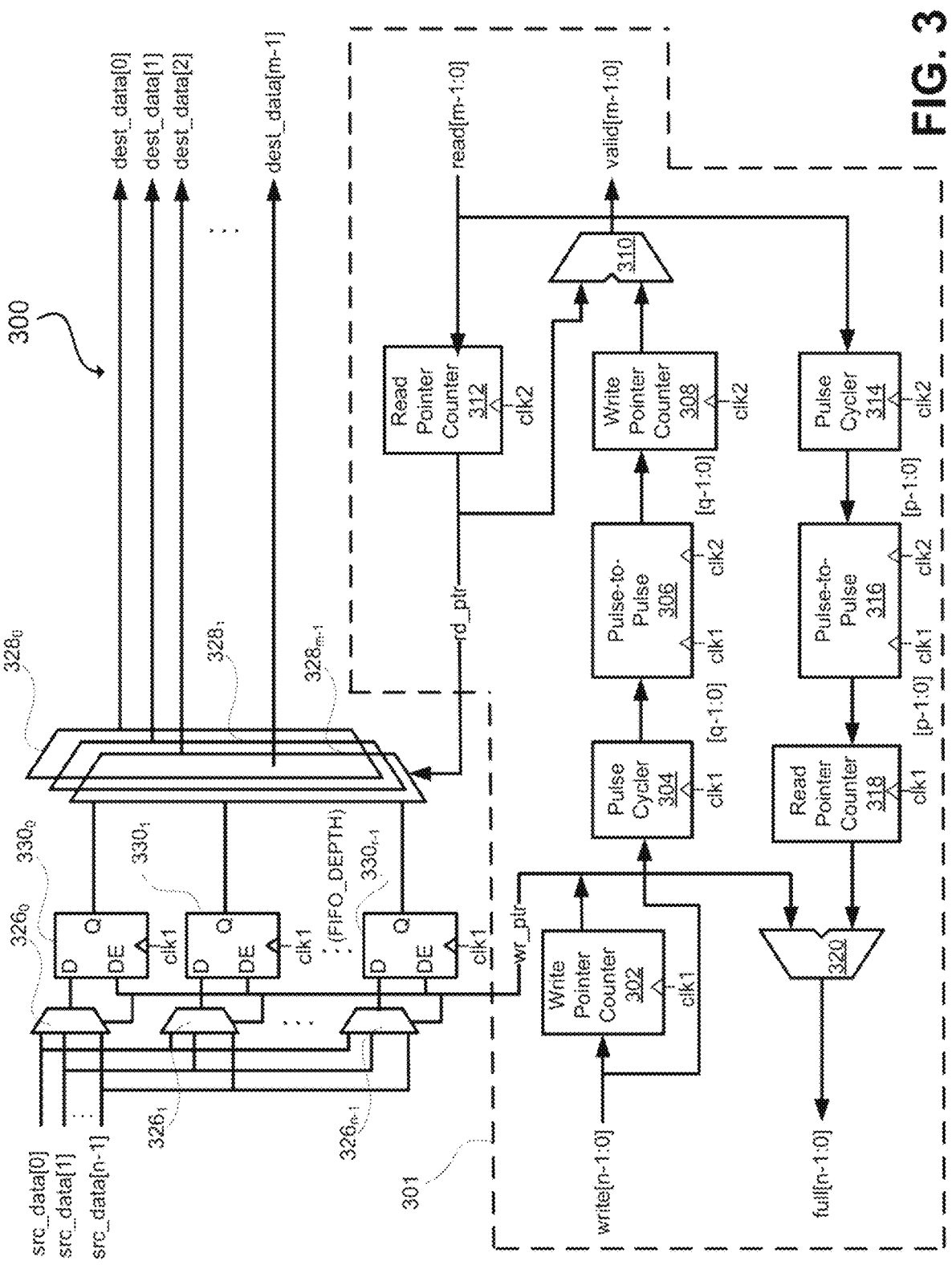
FIG. 3 illustrates an example synchronizing first-in-first-out buffer employing the pointer generation and synchronization circuit of FIG. 2.

FIG. 3 illustrates an example synchronizing first-in-first-out buffer (synchronizing FIFO) 300 employing the pointer generation and synchronization circuit 200 of FIG. 2. In particular, the example synchronizing FIFO 300 includes n input (write) ports (numbered 0 through n−1) and m output (read) ports (numbered 0 through m−1), where the values of m and n in FIG. 3 may be different than the values of m and n in FIG. 2. In some examples, n or m may be one. In other examples, both n and m are greater than one. Like the pointer generation and synchronization circuit 200 of FIG. 2, the synchronizing FIFO 300 includes at least two different clock domains, namely, a write clock domain and a read clock domain that run at different clock frequencies.

Words of data to be written to the synchronizing FIFO 300 may be written to any of the input (src_data) ports. In some examples where n is greater than one, data may be written to more than one of the input ports simultaneously (e.g., within a single write clock period). Each input port is coupled to the inputs of a first plurality of multiplexers $326_0$-$326_{n-1}$ (hereinafter individually referred to as a multiplexer 326 or collectively referred to as multiplexers 326). Collectively, the first plurality of multiplexers 326 may form a first crossbar circuit, i.e., an assembly of switches that connects a set of inputs to a set of outputs. In other examples, however, the first crossbar circuit may be configured in other manners (e.g., using components other than multiplexers).

In the case of FIG. 3, the first crossbar circuit connects the plurality of input ports to a plurality of storage elements $330_0$-$330_{r-1}$ (hereinafter individually referred to as a storage element 330 or collectively referred to as storage elements 330) for synchronizing data words. In one example, input words of data may be stored in each of the storage elements 330 in rotating stages until each word of data is read at an output port of the synchronizing FIFO. In one example, the number of storage elements 330 in the synchronizing FIFO 300 is equal to the number of multiplexers 326 in the first crossbar circuit. Thus, each multiplexer 326 may receive the input of every input port and may select one received input to pass on its output to a corresponding storage element 330.

The synchronizing FIFO 300 further includes at least one pointer generation and synchronization circuit 301. In one example, the pointer generation and synchronization circuit 301 may include a write line for instructing the synchronizing FIFO 300 to receive at least one word of data from among the input words to be stored in the storage elements 330 and may be further configured in a manner similar to the circuit 200 illustrated in FIG. 2 for synchronizing pointer increment signals. Thus, the pointer generation and synchronization circuit 301 may include at least: a first write pointer counter 302, a first pulse cycler 304, a first pulse-to-pulse synchronizing circuit 306, a second write pointer counter 308, a first comparator 310, and a first read pointer counter 312. In this case, the pointer generation and synchronization circuit 301 would resemble the top half of the circuit 200 illustrated in FIG. 2. In another example, the pointer generation and synchronization circuit 301 may further include a second pulse cycler 314, a second pulse-to-pulse synchronizing circuit 316, a second read pointer counter 318, and a second comparator 320. In this case, the pointer generation and synchronization circuit 301 would resemble the entirety of the circuit 200 illustrated in FIG. 2 (as illustrated in FIG. 3). In yet another example, the pointer generation and synchronization circuit 301 may include the second pulse cycler 314, the second pulse-to-pulse synchronizing circuit 316, the second read pointer counter 318, and the second comparator 320, but omit the first write pointer counter 302, the first pulse cycler 304, the first pulse-to-pulse synchronizing circuit 306, the second write pointer counter 308, the first comparator 310, and the first read pointer counter 312. In this case, the pointer generation and synchronization circuit 301 would resemble the bottom half of the circuit 200 illustrated in FIG. 2.

The first write pointer counter 302, the first pulse cycler 304, the first pulse-to-pulse synchronizing circuit 306, the second write pointer counter 308, the first comparator 310, the first read pointer counter 312, the second pulse cycler 314, the second pulse-to-pulse synchronizing circuit 316, the second read pointer counter 318, and the second comparator 320 may operate in a manner similar to the first write pointer counter 202, the first pulse cycler 204, the first pulse-to-pulse synchronizing circuit 206, the second write pointer counter 208, the first comparator 210, the first read pointer counter 212, the second pulse cycler 214, the second pulse-to-pulse synchronizing circuit 216, the second read pointer counter 218, and the second comparator 220 illustrated and discussed in connection with FIG. 2.

In one example, the first pulse-to-pulse synchronizing circuit 306 of the pointer generation and synchronization circuit 301 includes q individual pulse-to-pulse synchronizing circuits 306 (e.g., as illustrated in the pulse-to-pulse synchronizing circuit 104 in the inset of FIG. 1) in order to generate q increment signals (labeled 0 through q−1 in FIG. 3) when passing data from the write clock domain to the read clock domain, while the second pulse-to-pulse synchronizing circuit 316 includes p individual pulse-to-pulse synchronizing circuits in order to generate p increment signals (labeled 0 through p−1 in FIG. 3) when passing data from the read clock domain to the write clock domain. In one example, the number of increment strobe bits needed in either direction may be calculated by multiplying the number of ports of the synchronizing FIFO 300 from which the pulse-to-pulse synchronizer circuit receives data by the maximum number of clock cycles on the source side that may occur between each adjacent pair of rising edges of the clock on the destination side. Thus, for the first pulse-to-pulse synchronizing circuit 306, q would be equal to n multiplied by the number of write clock cycles that may occur between each pair of rising edges of the read clock; for the second pulse-to-pulse synchronizing circuit 316, p would be equal to m multiplied by the number of read cycles that may occur between each pair of rising edges of the write clock.

An output of each storage element 330 is coupled to an input of each multiplexer $328_0$-$328_{m-1}$ of a second plurality of multiplexers (hereinafter individually referred to as a multiplexer 328 or collectively referred to as multiplexers 328), so that each multiplexer 328 of the second plurality of multiplexers can select a word of data from any storage element 330 of the plurality of storage elements in order to generate an output word of data to be read on a respective output (dest_data) port of the synchronizing FIFO 300. Collectively, the second plurality of multiplexers 328 may form a second crossbar circuit. In other examples, however, the second crossbar circuit may be configured in other manners (e.g., using components other than multiplexers).

The second crossbar circuit also receives a pointer generated in the second clock domain from the first read pointer counter 312. The second crossbar circuit may utilize the pointer generated in the second clock domain to select a word of data from one of the storage elements 330. The selected word of data may be utilized to generate an output word of data for output on an output port of the synchronizing FIFO 300.

In one example, the number of multiplexers 328 in the second crossbar circuit is equal to the number of output ports in the synchronizing FIFO 300 (e.g., m in FIG. 3). In some examples, data may be read on more than one of the output ports simultaneously. As illustrated, the number of output ports of the synchronizing FIFO 300 is not necessarily equal to the number of input ports of the synchronizing FIFO 300. For instance, in another example, the synchronizing FIFO 300 may include a single multiplexer 328 that receives all the outputs of all of the storage elements 330 and a single output port.

When a word of data is to be read, the first read pointer counter 312 may pass a read pointer (rd_ptr) generated in the second clock domain to the second crossbar circuit (e.g., the plurality of multiplexers 328) and also to the first comparator 310. Additionally, the first comparator 310 receives the output of the second write pointer counter 308 (i.e., a write pointer that has been synchronized from the first clock domain to the second clock domain). If the read pointer generated in the second clock domain fails to match the output of the second write pointer counter 308, then the first comparator may generate a "valid" flag to indicate that the output ports contain valid data (e.g., can perform a requested data read); if, on the other hand, the read pointer generated in the second clock domain matches the output of the second write pointer 308 counter, then the first comparator may generate an "empty" flag to indicate that the output ports are empty (e.g., cannot perform a requested data read).

It should be noted that the synchronizing FIFO 300 may generate more than one "full" flag and/or more than one "empty" flag. If the synchronizing FIFO 300 includes more than one read (dest_data) port, then downstream logic will need to know which of the read ports are empty (or, conversely, which read ports contain valid data). Similarly, if the synchronizing FIFO 300 includes more than one write (src_data) port, the upstream logic will need to know when the synchronizing FIFO 300 is too full to accept every possible number of asserted signals on the write ports. For instance, although the synchronizing FIFO 300 may not be too full to accept two writes, the synchronizing FIFO 300 may be too full to accept three or more writes.

It should be noted that a synchronizing FIFO such as the synchronizing FIFO 300 of FIG. 3 is one example of an application that may benefit from the disclosed circuit for synchronizing pointer increment signals. Synchronizing FIFOs are one of the most common applications in which pointers are synchronized from one clock domain to another clock domain, but are by no means the only such application.

FIG. 4 illustrates an example method 400 for conveying pointer information from a first clock domain to a different, second clock domain via an increment signal, according to the present disclosure. In one example, the method 400 may be performed by a circuit for synchronizing pointer increment signals, such as the circuit 100 of FIG. 1 or the circuit 200 of FIG. 2. In another example, the method 400 may be performed by a synchronizing FIFO such as the synchronizing FIFO 300 of FIG. 3, which includes a plurality of synchronizing circuits configured as illustrated in FIG. 2. In another example, the method 400 may be performed by one or more components of a computer system, such as the computer system 500. For the sake of example, the method 400 is described as being performed by a processing system.

At 402, the processing device may receive an electronic signal having a single clockwide pulse in a first clock domain that runs at a first clock frequency.

The electronic signal may also be referred to as a strobe. In one example, the electronic signal is received from an upstream circuit that is running in the first clock domain. In one example, the electronic signal may be either a data write (e.g., input) signal or a data write (e.g. output signal). Thus, the first clock domain may be either a write clock domain or a read clock domain, and the electronic signal may or may not be provided with data.

At 404 (illustrated in phantom), the processing device may generate a plurality of clockwide pulses in proportion to a ratio of the first clock frequency to a second clock frequency relative to a second clock frequency. In certain embodiments, 404 can be omitted.

In one example, 404 is performed when the first clock domain is faster (i.e., operating at a higher frequency) than the second clock domain. In such an instance, the processing device may control a pulse cycler to cycle through a plurality of clockwide pulses (or increment signals) so that the inherent bandwidth limitations of the slower second clock domain are not violated. The number of clockwide pulses in the plurality of clockwide pulses will be proportionate to (e.g., some multiple of, with rounding) the ratio of the first clock frequency relative to the second clock frequency.

For instance, if the ratio of the first clock frequency to the second clock frequency is 1.5 (i.e., the first clock domain is running 1.5 times faster than the second clock domain), then that means that as many as two clockwide pulses in the first clock domain may occur between every adjacent pair of clock rising edges in the second clock domain. As such, the pulse cycler may alternate between two clockwide pulses in order to ensure that no increment information is lost in the transition from the first clock domain to the second clock domain. In general, the number of clockwide pulses that the pulse cycler will cycle through is equal to the number of clock rising edges in the faster clock domain that can occur between each adjacent pair of rising edges of the slower clock domain, multiplied by the maximum possible number electronic signals that can be asserted in one period of the first clock domain.

At 406, the processing device may convert the electronic signal to a single clockwide pulse in the second clock domain that runs at the second clock frequency.

In one example, the processing device may control a pulse-to-pulse synchronizer circuit to convert the electronic signal to the single clockwide pulse the second clock domain. As discussed above, the first clock domain may be faster than or slower than the second clock domain; at 406 the data signal is conveyed from the first clock domain to the second clock domain regardless of which clock domain operates at the higher frequency. In another example, the first clock domain and the second clock domain may operate at equal clock frequencies, but the phase relationship between the first clock domain and the second clock domain may be unknown, insufficiently constrained, or varying. In one example, converting the electronic signal to the single clockwide pulse in the second clock domain may involve processing a plurality of increment signals (e.g., if 404 has been performed).

At 408, the processing device may advance a count of a pointer counter in response to the single clockwide pulse in the second clock domain.

In one example, the processing device increments the count of the pointer counter by an amount that is equal to a number of the increment signals processed at 406. If a single increment signal is processed at 406 (e.g., the first clock domain is slower than the second clock domain), then the processing device advances the count of the pointer counter by a value of one. If x increment signals are processed at 406 (e.g., the first clock domain is faster than the second clock domain and/or the data signal includes a plurality of words), then the processing device increments the count of the pointer counter by a value of x.

At 410, the processing device may output a pointer associated with the electronic signal based on the count. In one example, the pointer is output to a downstream circuit that is running in the second clock domain.

In further examples of the present disclosure, weights may be applied to the increment signals described above. For instance, in the examples described in connection with FIGS. 1-4, each increment signal may be considered to have a weight of one, such that the count of the pointer counter is incremented by a value of one for each increment signal that is processed. However, in a further example, at least one of the increment signals that is processed may be weighted to have a weight that is greater than one, which would cause the count of the pointer counter to be incremented by a value greater than one (e.g., by a number that is equal to the weight of the increment signal).

Weighting an increment signal in this manner will reduce the number of increment signals required to synchronize data from a first clock domain to a second clock domain. Reducing the number of increment signals required will in turn reduce the amount of circuitry needed to support the synchronization of data, thereby conserving valuable physical circuit space, circuit power consumption, and manufacturing costs. In one example, weighting of increment signals may be facilitated by modifying the pulse-to-pulse synchronizer circuit.

Figure 5:
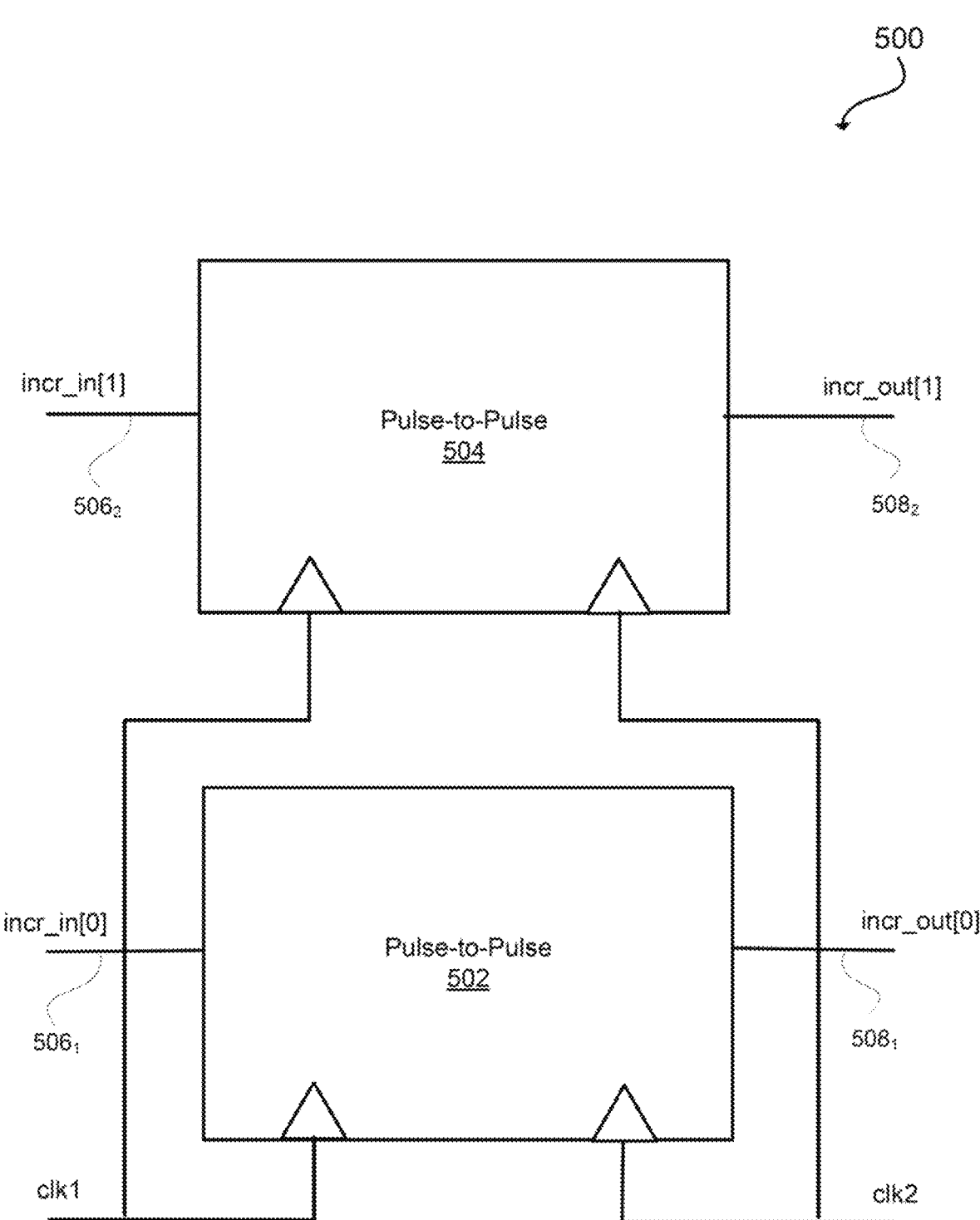
FIG. 5 illustrates an example pulse-to-pulse synchronizer circuit that may be used to generate weighted increment signals, according to the present disclosure.

FIG. 5 illustrates an example pulse-to-pulse synchronizer circuit 500 that may be used to generate weighted increment signals, according to examples of the present disclosure. The pulse-to-pulse synchronizer circuit 500 may be part of a larger circuit, such as a synchronizing FIFO (e.g., similar to the synchronizing FIFO 300 of FIG. 3). The pulse-to-pulse synchronizer circuit 500 may replace any of the pulse-to-pulse synchronizer circuits 104, 206, 216, 306, or 316 discussed above. For instance, as discussed in connection with FIG. 2, in some examples a pulse-to-pulse synchronizer circuit may include a bank of pulse-to-pulse synchronizer circuits, where the number of the pulse-to-pulse synchronizer circuits in the bank of pulse-to-pulse synchronizer circuits is equal to the number of increment signals that can be simultaneously asserted. In the example of FIG. 5, however, a bank of pulse-to-pulse synchronizer circuits includes two pulse-to-pulse synchronizer circuits, i.e., a first pulse-to-pulse synchronizer circuit 502 and a second pulse-to-pulse synchronizer circuit 504, and may be configured to simultaneously assert any number of increment signals, including numbers greater than the number of pulse-to-pulse synchronizer circuits in the bank of pulse-to-pulse synchronizer circuits. In other words, at least one of the pulse-to-pulse synchronizer circuits 502 or 504 is configured to simultaneously assert two or more increment signals.

In one example, the first pulse-to-pulse synchronizer circuit 502 may receive a first increment signal (incr_in[0]) as a clockwide pulse 506₁ in a first clock domain (clk1) and may output the first increment signal (incr_out[0]) as a clockwide pulse 508₁ in a different, second clock domain (clk2). In some examples, the first increment signal (incr_in [0]) may be received as the clockwide pulse 506₁ from a pulse cycler or directly from a pointer counter. The second clock domain may be slower than the first clock domain or faster than the first clock domain. In another example, the first clock domain and the second clock domain may operate at equal clock frequencies, but the phase relationship between the first clock domain and the second clock domain may be unknown, insufficiently constrained, or varying.

In one example, a weight of the first increment signal that is output by the first pulse-to-pulse synchronizer circuit 502 (incr_out[0]) is one. This means that the clock pulse 5081 in the second clock domain will cause a pointer counter that receives the clock pulse 5081 to increment its count by a value of one.

In one example, the second pulse-to-pulse synchronizer circuit 504 may receive a second increment signal (incr_in [1]) as a clockwide pulse 5062 in the first clock domain and may output the second increment signal (incr_out[1]) as a clockwide pulse 5082 in the second clock domain. In some examples, the second increment signal (incr_out[1]) may be received as the clockwide pulse 5082 from a pulse cycler or directly from a pointer counter.

In one example, a weight of the second increment signal that is output by the second pulse-to-pulse synchronizer circuit 504 (incr_out[1]) is greater than one (e.g., is two or more). This means that the clockwide pulse 5082 in the second clock domain will cause a pointer counter that receives the clockwide pulse 5082 to increment its count by a value of at least two (i.e., a value that is equal to the weight of the second increment signal incr_out[1]). In a further example, the weight of the second increment signal (incr_out[1]) may be equal to one less than the total number of increment signals that can be simultaneously asserted by the pulse-to-pulse synchronizer circuit 500. For instance, if the pulse-to-pulse synchronizer circuit 500 is configured to assert n increment signals, then the weight of the second increment signal (incr_out[1]) may be n−1. In one example, the total number of increment signals that can be simultaneously asserted by the pulse-to-pulse synchronizer circuit 500 may be configurable and may vary depending upon the application of the circuit in which the pulse-to-pulse synchronizer circuit 500 is deployed. Although the pulse-to-pulse synchronizer circuit 500 of FIG. 5 is illustrated as including a bank of two pulse-to-pulse synchronizer circuits, it will be appreciated that in other examples, the bank of pulse-to-pulse synchronizer circuits may include any number of pulse-to-pulse synchronizer circuits, including one pulse-to-pulse synchronizer circuit or more than two pulse-to-pulse synchronizer circuits, as long as at least one pulse-to-pulse synchronizer circuit in the bank of pulse-to-pulse synchronizer circuits is configured to weight incoming clockwide pulses by a value that is greater than one.

FIG. 6 illustrates an example method 600 for conveying pointer information from a first clock domain to a different, second clock domain via a weighted increment signal, according to the present disclosure. In one example, the method 600 may be performed by a circuit for synchronizing pointer increment signals, such as the circuit 100 of FIG. 1 or the circuit 200 of FIG. 2, where the pulse-to-pulse synchronizing circuit 104 or the pulse-to-pulse synchronizing circuit 206 or 216 may be configured as illustrated in FIG. 5. In another example, the method 600 may be performed by a synchronizing FIFO such as the synchronizing FIFO 300 of FIG. 3, which includes a plurality of synchronizing circuits configured as illustrated in FIG. 2 (and where the pulse-to-pulse synchronizing circuits 306 and 316 may be configured as illustrated in FIG. 5). In another example, the method 600 may be performed by one or more components of a computer system, such as the computer system

700. For the sake of example, the method 600 is described as being performed by a processing device.

At 602, the processing device may receive an electronic signal including a first plurality of clockwide pulses in a first clock domain that runs at a first clock frequency.

The electronic signal may also be referred to as a strobe. In one example, the electronic signal is received from an upstream circuit that is running in the first clock domain. In one example, the electronic signal may be either a data write (e.g., input) signal or a data read (e.g., output signal). Thus, the first clock domain may be either a write clock domain or a read clock domain, and the electronic signal may or may not be provided with data.

At 604, the processing device may convert a first portion of the electronic signal to a first clockwide pulse in a second clock domain that runs at a second clock frequency, using a first pulse-to-pulse synchronizer circuit of a bank of pulse-to-pulse synchronizer circuits, wherein the first pulse-to-pulse synchronizer circuit weights the first clockwide pulse by a first value, and wherein the first value is greater than one (e.g., is two or greater).

In one example, the second clock domain may be slower than the first clock domain or faster than the first clock domain. In another example, the first clock domain and the second clock domain may operate at equal clock frequencies, but the phase relationship between the first clock domain and the second clock domain may be unknown, insufficiently constrained, or varying.

In one example, the first portion of the electronic signal may be an entirety of the electronic signal. In this case, the first value may have a value that is equal to a number of increment signals asserted in the plurality of clockwide pulses. In another example, the first portion of the electronic signal may be less than an entirety of the electronic signal. In this case, the first value may be a value that is greater than one, but less than the number of increment signals asserted in the plurality of clockwide pulses. For instance, if n increment signals are asserted in the plurality of clockwide pulses, then the first value in this example may be any number between and including two and n−1. Thus, the first clockwide pulse that is generated by the first pulse-to-pulse synchronizer circuit may assert, in a single clockwide pulse, two or more increment signals.

At 606 (illustrated in phantom), the processing device may optionally convert a second portion of the electronic signal to a second clockwide pulse in the second clock domain, using a second pulse-to-pulse synchronizer circuit of the bank of pulse-to-pulse synchronizer circuits, wherein the second pulse-to-pulse synchronizer circuit weights the second clockwide pulse by a second value.

In one example, the second portion of the electronic signal may be the portion of the electronic signal not included in the first portion of the electronic signal. That is, the first portion of the electronic signal and the second portion of the electronic signal may collectively form an entirety of the electronic signal. In this case, the second value may have a value that is less than a number of increment signals asserted in the plurality of clockwide pulses and/or less than the first value (but that, when summed with the first value, totals a number that is equal to the number of increment signals asserted in the plurality of clockwide pulses). In one particular example, the second value is equal to one. For instance, if n increment signals are asserted in the plurality of clockwide pulses, the first value in this example may be equal to n−1, while the second value may be equal to one. Thus, the second clockwide pulse that is generated by the second pulse-to-pulse synchronizer circuit may assert, in a single clockwide pulse, one increment signal.

606 may be considered optional, because in some examples, the first clockwide pulse may convert an entirety of the electronic signal. In this case, as discussed above, the first value may be equal to the number of increment signals asserted in the plurality of clockwide pulses, and a second clockwide pulse may therefore be unneeded. However, if the first clockwide pulse converted less than an entirety of the electronic signal (e.g., the first value is less than the number of increment signals asserted in the plurality of clockwide pulses), then the second clockwide pulse may be needed to convert any remaining portion (e.g., the second portion) of the electronic signal.

At 608, the processing system may advance a count of a pointer counter in response to the first clockwide pulse, where the count is advanced by a number that is at least equal to the first value.

Optionally, at 608, the count may also be advanced in response to the second clockwide pulse (if a second clockwide pulse is generated at 606). In this case, the count is advanced by a value that is equal to a sum of the first value and the second value.

Thus, in one example, the processing device increments the count of the pointer counter by an amount that is equal to the number of the increment signals in the plurality of clockwide pulses. Thus, if the first value is equal to n−1, and the second value is equal to one, then the processing device at 408 may advance the count of the pointer counter by a value of n.

At 610, the processing device may output a pointer associated with the electronic signal based on the count. In one example, the pointer is output to a downstream circuit that is running in the second clock domain.

As discussed above, a bank of pulse-to-pulse synchronizing circuits according to the present disclosure may include any number of pulse-to-pulse synchronizing circuits, and each pulse-to-pulse synchronizing circuit in the bank of pulse-to-pulse synchronizing circuits may be configured to weight an output increment signal by any number. However, the number of pulse-to-pulse synchronizing circuits, as well as the weights that each pulse-to-pulse synchronizing circuit is capable of applying, may limit the number of increment signals that can be collectively output by the bank of pulse-to-pulse synchronizing circuits in a single clock period.

For instance, referring again to the example of FIG. 5, the first pulse-to-pulse synchronizing circuit 502 may be configured to apply a weight of one, while the second pulse-to-pulse synchronizing circuit 504 may be configured to apply a weight of two. This allows the pulse-to-pulse synchronizing circuit 500 to output any of the following number of increment signals in a single clock period: zero (i.e., neither the first pulse-to-pulse synchronizing circuit 502 nor the second pulse-to-pulse synchronizing circuit 504 outputs an increment signal), one (i.e., only the first pulse-to-pulse synchronizing circuit 502 outputs an increment signal), two (i.e., only the second pulse-to-pulse synchronizing circuit 504 outputs an increment signal), or three (i.e., both the first pulse-to-pulse synchronizing circuit 502 and the second pulse-to-pulse synchronizing circuit 504 output increment signals).

However, if the second pulse-to-pulse synchronizing circuit 504 was configured to apply a weight of three, then it would not be possible for the pulse-to-pulse synchronizing circuit 500 to output two increment signals in a single clock period (unless the bank of pulse-to-pulse synchronizing circuits 500 included a third pulse-to-pulse synchronizing circuit that was configured to apply a weight of either one or two). If the second pulse-to-pulse synchronizing circuit 504 in FIG. 5 was configured to apply a weight of three, this would allow the pulse-to-pulse synchronizing circuit 500 to output any of the following number of increment signals in a single clock period: zero (i.e., neither the first pulse-to-pulse synchronizing circuit 502 nor the second pulse-to-pulse synchronizing circuit 504 outputs an increment signal), one (i.e., only the first pulse-to-pulse synchronizing circuit 502 outputs an increment signal), three (i.e., only the second pulse-to-pulse synchronizing circuit 504 outputs an increment signal), or four (i.e., both the first pulse-to-pulse synchronizing circuit 502 and the second pulse-to-pulse synchronizing circuit 504 output increment signals).

Thus, the number of pulse-to-pulse synchronizing circuits in the bank of pulse-to-pulse synchronizing circuits and the weights that each pulse-to-pulse synchronizing circuit is configured to apply may be selected to support the needs of a particular application (e.g., in terms of how many simultaneous increment signals the particular application may need to assert in a single clock period). For instance, a synchronizing FIFO having three parallel data inputs that are all writing data into the FIFO on the same input clock would require three simultaneous increment signals. As another example, a synchronizing FIFO having a single data input, but having an input-side clock frequency that is between three and four times the output clock frequency would also require three simultaneous increment signals. From the output-side point of view, all three increment signals will appear to be asserted at the same time in cases where three writes happened on three consecutive input clocks which happened to be between two adjacent output side clock rising edges.

Thus, in one example of the present disclosure, a non-transitory computer readable medium includes stored instructions which, when executed by a processor, cause the processor to convert an input clockwide pulse received from an upstream circuit running in a first clock domain into an output clockwide pulse that is synchronized to a second clock domain. The instructions further cause the processor to advance a count in response to the output clockwide pulse that is synchronized to the second clock domain.

In another example, a synchronizing first-in-first-out buffer includes a first crossbar circuit that receives a plurality of input words of data from a plurality of inputs ports and selects a storage element of a plurality of storage elements to which to provide each input word of data of the plurality of input words of data, wherein the plurality of input words of data are in a first clock domain, and a pointer generation and synchronization circuit having an input to receive an input clockwide pulse generated in the first clock domain. The pointer generation and synchronization circuit includes a pulse-to-pulse synchronizer circuit to convert the input clockwide pulse into an output clockwide pulse that is synchronized to a second clock domain, a first pointer counter having an input coupled to an output of the pulse-to-pulse synchronizing circuit, to advance a count in response to receiving the output clockwide pulse that is synchronized to the second clock domain, and a second pointer counter to receive a pointer generated in the second clock domain. The example synchronizing first-in-first-out buffer further includes a second crossbar circuit to receive the plurality of input words of data from the plurality of storage elements and to receive the pointer generated in the second clock domain and to generate an output word of data selected from among the plurality of input words of data based on the pointer generated in the second clock domain.

In another example, a method performed by a processing device includes receiving an electronic signal including a single clockwide pulse in a first clock domain that runs at a first clock frequency. The single clockwide pulse in the first clock domain is converted to a single clockwide pulse in a second clock domain that runs at a second clock frequency. A count of a pointer counter is advanced in response to the single clockwide pulse in the second clock domain, and a pointer associated with the electronic signal is outputted based on the count.

Figure 7:
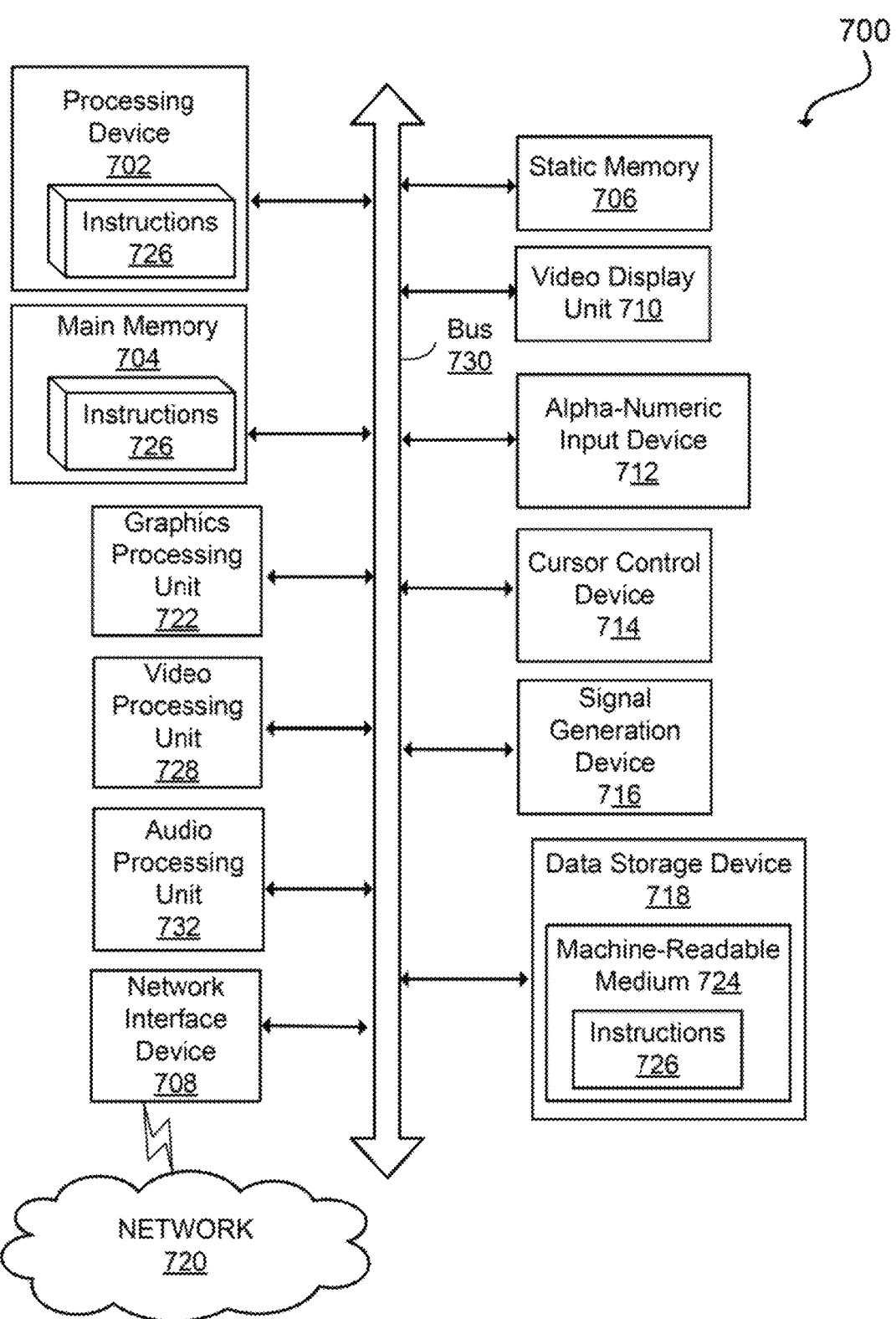
FIG. 7 illustrates a diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A non-transitory computer readable medium comprising stored instructions, which when executed by a processor, cause the processor to:

receive an electronic signal including a first plurality of clockwide pulses in a first clock domain that runs at a first clock frequency;

convert a first portion of the electronic signal to a first clockwide pulse in a second clock domain that runs at a second clock frequency, using a first pulse-to-pulse synchronizer circuit of a bank of pulse-to-pulse synchronizer circuits, wherein the first pulse-to-pulse synchronizer circuit weights the first clockwide pulse by a first value, and wherein the first value is greater than one; and advance a count of a pointer counter in response to the first clockwide pulse, where the count is advanced by a number that is at least equal to the first value.

2. The non-transitory computer readable medium of claim 1, wherein the first clock frequency is higher than the second clock frequency.

3. The non-transitory computer readable medium of claim 1, wherein the second clock frequency is higher than the first clock frequency.

4. The non-transitory computer readable medium of claim 1, wherein the first clock frequency is equal to the second clock frequency, but a phase relationship between the first clock domain and the second clock domain is different.

5. The non-transitory computer readable medium of claim 1, wherein the stored instructions further cause the processor to:

convert a second portion of the electronic signal to a second clockwide pulse in the second clock domain, using a second pulse-to-pulse synchronizer circuit of the bank of pulse-to-pulse synchronizer circuits, wherein the second pulse-to-pulse synchronizer circuit weights the second clockwide pulse by a second value.

6. The non-transitory computer readable medium of claim 5, wherein the count is advanced by a number that is equal to a sum of the first value and the second value.

7. The non-transitory computer readable medium of claim 5, wherein the second value is different from the first value.

8. The non-transitory computer readable medium of claim 1, wherein the processor comprises a component of a synchronizing first in, first out buffer, and the count indicates a pointer pointing to a location in the synchronizing first in, first out buffer at which a data word is stored.

9. The non-transitory computer readable medium of claim 8, wherein the synchronizing first in, first out buffer receives a plurality of input words of data in a single input clock period.

10. The non-transitory computer readable medium of claim 8, wherein the synchronizing first in, first out buffer provides a plurality of output words of data to a downstream circuit in a single output clock period.

11. A synchronizing first-in-first-out buffer, comprising:

an input port that receives a plurality of input words of data from a plurality of input ports and selects a storage element of a plurality of storage elements to which to provide each input word of data of the plurality of input words of data, wherein the plurality of input words of data are in a first clock domain;

a pointer generation and synchronization circuit having an input to receive an input clockwide pulse generated in the first clock domain, the pointer generation and synchronization circuit comprising:

a first pulse-to-pulse synchronizer circuit to convert at least a portion of the input clockwide pulse into an output clockwide pulse that is synchronized to a second clock domain, wherein the first pulse-to-pulse synchronizer circuit is configured to weight at least a portion of the output clockwide pulse by a first value that is greater than one;

a first pointer counter having an input coupled to an output of the first pulse-to-pulse synchronizing circuit, to advance a count in response to receiving the output clockwide pulse that is synchronized to the second clock domain by a value that is at least equal to the first value; and a second pointer counter to receive a pointer generated in the second clock domain; and an output port to receive the plurality of input words of data from the plurality of storage elements and to receive the pointer generated in the second clock domain and to generate an output word of data selected from among the plurality of input words of data based on the pointer generated in the second clock domain.

12. The synchronizing first-in-first-out buffer of claim 11, wherein the pointer generation and synchronization circuit further comprises:

a second pulse-to-pulse synchronizer circuit to convert another portion of the input clockwide pulse into another output clockwide pulse that is synchronized to the second clock domain, wherein the second pulse-to-pulse synchronizer circuit is configured to weight at least a portion of the output clockwide pulse by a second value.

13. The synchronizing first-in-first-out buffer of claim 12, wherein the second pointer counter is configured to advance a count by a number that is equal to a sum of the first value and the second value.

14. The synchronizing first-in-first-out buffer of claim 12, wherein the second value is different from the first value.

15. A method, comprising:

receiving an electronic signal including a first plurality of clockwide pulses in a first clock domain that runs at a first clock frequency;

converting a first portion of the electronic signal to a first clockwide pulse in a second clock domain that runs at a second clock frequency, using a first pulse-to-pulse synchronizer circuit of a bank of pulse-to-pulse synchronizer circuits, wherein the first pulse-to-pulse synchronizer circuit weights the first clockwide pulse by a first value, and wherein the first value is greater than one;

converting a second portion of the electronic signal to a second clockwide pulse in the second clock domain, using a second pulse-to-pulse synchronizer circuit of the bank of pulse-to-pulse synchronizer circuits, wherein the second pulse-to-pulse synchronizer circuit weights the second clockwide pulse by a second value that is equal to one;

advancing a count of a pointer counter in response to the first clockwide pulse, where the count is advanced by a number that is equal to a sum of the first value and the second value; and outputting a pointer associated with the electronic signal based on the count.

16. The method of claim 15, wherein the first clock frequency is higher than the second clock frequency.

17. The method of claim 15, wherein the second clock frequency is higher than the first clock frequency.

18. The method of claim 15, wherein the first clock frequency is equal to the second clock frequency, but a phase relationship between the first clock domain and the second clock domain is different.

19. The method of claim 15, wherein the bank of pulse-to-pulse synchronizer circuits comprises a component of a synchronizing first in, first out buffer, and the count indicates a pointer pointing to a location in the synchronizing first in, first out buffer at which a data word is stored.

20. The method of claim 19, wherein the synchronizing first in, first out buffer receives a plurality of input words of data in a single input clock period.

* * * * *